United States Patent
Derra et al.

(10) Patent No.: US 8,338,797 B2
(45) Date of Patent: Dec. 25, 2012

(54) DEBRIS MITIGATION DEVICE WITH ROTATING FOIL TRAP AND DRIVE ASSEMBLY

(75) Inventors: Guenther Hans Derra, Aachen (DE); Michael Schaaf, Herzogenrath (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 140 days.

(21) Appl. No.: 12/918,827

(22) PCT Filed: Feb. 25, 2009

(86) PCT No.: PCT/IB2009/050742
§ 371 (c)(1),
(2), (4) Date: Aug. 23, 2010

(87) PCT Pub. No.: WO2009/107063
PCT Pub. Date: Sep. 3, 2009

(65) Prior Publication Data
US 2011/0002569 A1      Jan. 6, 2011

(30) Foreign Application Priority Data

Feb. 28, 2008   (EP) .................................. 08102119

(51) Int. Cl.
*H01J 27/00*      (2006.01)

(52) U.S. Cl. ..................... 250/424; 250/423 R; 250/425; 250/492.1; 250/492.2; 250/493.1; 250/503.1; 250/504 R

(58) Field of Classification Search ............... 250/493.1, 250/503.1, 504 R, 492.1, 492.2, 423 R, 424, 250/425
See application file for complete search history.

(56) References Cited

U.S. PATENT DOCUMENTS

| | | |
|---|---|---|
| 2004/0184014 A1 | 9/2004 | Bakker et al. |
| 2006/0017027 A1 | 1/2006 | Bristol |
| 2006/0067476 A1 | 3/2006 | Bloom et al. |
| 2007/0018118 A1 | 1/2007 | Sjmaenok et al. |
| 2007/0228290 A1 | 10/2007 | Wildenberg |

FOREIGN PATENT DOCUMENTS

| | | |
|---|---|---|
| EP | 1306592 A2 | 5/2003 |
| JP | 05099176 A | 4/1993 |
| WO | 0101736 A1 | 1/2001 |
| WO | 03026363 A1 | 3/2003 |
| WO | 03034153 A2 | 4/2003 |
| WO | 2006134512 A2 | 12/2006 |
| WO | 2007133072 A2 | 11/2007 |
| WO | 2008035965 A2 | 3/2008 |

*Primary Examiner* — Michael Maskell
*Assistant Examiner* — Hanway Chang
(74) *Attorney, Agent, or Firm* — Mark L. Beloborodov

(57) ABSTRACT

The present invention relates to a debris mitigation device for use with a radiation source (2) generating optical radiation, in particular extreme ultraviolet radiation (EUV) or soft x-rays, and emitting undesired substances and/or particles which can deposit on optical surfaces in a radiation path of said radiation source (2), and to a corresponding drive assembly. The debris mitigation device comprises at least one rotating foil trap (5) and the drive assembly. The drive assembly comprises a driving motor (14) and a driving axis (10), to which the rotating foil trap (5) is fixed. The driving motor (14) and bearings (13) supporting the driving axis (10) are enclosed in a casing (20) having an aperture for the driving axis (10) and at least one outlet opening (21) for a sealing gas. The outlet opening (21) is connectable to a pump for pumping out the sealing gas. The aperture is designed to define a gap (23) between the driving axis (10) and the casing (20), wherein said gap (23) is connected to a supply pipe (19) for supplying the sealing gas through said gap (23) into said casing (20). The proposed debris mitigation device allows the use of conventional driving motors and oiled or lubricated bearings without the risk of contamination of the vacuum chamber in which the debris mitigation device is used. This results in an enhanced service life of the driving assembly.

13 Claims, 6 Drawing Sheets

DEBRIS MITIGATION DEVICE WITH ROTATING FOIL TRAP AND DRIVE ASSEMBLY

FIELD OF THE INVENTION

The present invention relates to a debris mitigation device for use with a radiation source generating optical radiation, in particular extreme ultraviolet radiation (EUV) or soft x-rays, and emitting undesired substances and/or particles which can deposit on optical surfaces in a radiation path of said radiation source, wherein said debris mitigation device comprises at least one rotating foil trap and a drive unit comprising a driving motor and a driving axis, to which said rotating foil trap is fixed.

The debris mitigation system of the present invention is in particular applicable in irradiation units emitting extreme ultraviolet radiation or soft x-rays in the wavelength range between approximately 1 nm to 20 nm. An exemplary application field is EUV lithography required for fabrication of integrated circuits with structures having dimensions of only view nm.

EUV-irradiation units for EUV-lithography comprise as key elements a radiation source emitting the EUV-radiation and an illumination optics for projecting the structure of a mask onto a wafer substrate. In the case of EUV-lithography, the optical components are reflective mirrors since effective transmissive optical components are not known for this wavelength region. The required EUV-radiation is generated by a plasma discharge which forms the radiation source of the irradiation unit. Apart from the EUV-radiation such a plasma, however, also emits substances and/or particles which can deposit on the optical surfaces of the illumination optics. Dependent on the kind of EUV-radiation source these particles can comprise neutral atoms, ions, clusters or droplets of different chemical consistence. The totality of such undesired particle emissions of an EUV-radiation source is called debris. In an EUV-irradiation unit, the collector—which may consist of one or several mirrors—close to the radiation source can be contaminated or damaged by such debris. In order to minimize the contamination or damage, debris mitigation systems are used between the radiation source and the optical components, in particular the collector, of such an irradiation unit.

BACKGROUND OF THE INVENTION

A known method of debris mitigation is the supply of a buffer gas between the EUV-radiation source and the collector. The debris particles, in the case of atoms or ions, slow down by the collisions with the gas atoms and are deflected from their original flight direction. With a sufficiently high density of the buffer gas the debris particles can be essentially stopped on their way to the collector. If the debris also contains condensable matter, for example metal atoms or metal droplets, an additional debris mitigation device is used between the EUV-radiation source and the collector. Such a debris mitigation device comprises a structure having passages for the straight pass of the radiation to the collector, wherein the debris material mainly condenses on the walls of this structure and therefore does not reach the collector.

Known debris mitigation devices are composed of several thin sheets or foils of a solid material arranged in a parallel, concentric or honeycomb structure forming manner, see for example WO 01/01736 A1. Such debris mitigation components are also called foil traps.

WO 03/034153 A1 discloses an embodiment of a debris mitigation device, in which the foil trap is separated by an intermediate space into two parts. The buffer gas is fed in this intermediate space. Due to this construction, the volume for plasma generation and the volume containing the collector can be maintained at a low pressure while the buffer gas in the intermediate space can be supplied with a higher pressure in order to effectively slow down the debris particles.

In order to effectively suppress the debris particles, a pressure of the buffer gas of several ten Pascal (cold pressure) over an interaction distance of several centimetres is required. The atomic weight of the buffer gas atoms should be similar to the atomic weight of the atoms and ions to be stopped in order to ensure the most effective momentum transfer.

EP 1 274 287 describes a debris mitigation device, in which the foil trap is rotated about the central optical axis. By this rotation, slowly moving, but relatively large and heavy droplets being nearly not deflected by collisions with the buffer gas atoms and therefore passing through the foil trap, can collide with the rotating foils of the foil trap and are mainly adsorbed by the surface of these foils.

In such a debris mitigation device a drive unit is necessary to rotate the foil trap. Such a drive unit comprises a driving motor and a driving axis to which the rotating foil trap is attached or fixed. The driving axis is usually supported by two bearings, for example ball bearings, in order to allow stable rotation of the driving axis and to ensure a precise alignment of the rotational axis. When using a debris mitigation device with a EUV radiation source, the radiation source together with the debris mitigation device and the collecting optics must be operated under vacuum conditions, wherein only the use of an additional buffer gas is allowed. In order to avoid contamination of the delicate optical surfaces of such a system, the purity requirements for the vacuum within the whole system are very high. This causes problems with the use of a drive unit. Already very small portions of for example hydrocarbons which are part of oil or grease vapors must be avoided. Therefore, the bearings of the driving motor cannot be oiled or lubricated and a special gas tight or vacuum-compatible driving motor must be used in order to minimize outgassing. Under such conditions the service life of the bearings is very short due to inevitable mechanical wear. For the bearings even when using selected materials and highest precision, only operation periods of some 100 h are achievable. Such short operation periods are not acceptable for applications in lithographic systems for semiconductor production.

SUMMARY OF THE INVENTION

It is an object of the present invention to provide a debris mitigation device with rotating foil trap and a corresponding drive assembly, which allow an operation in illumination systems with EUV radiation sources with a higher service life of the driving motor.

The objective is achieved with the debris mitigation device and the driving assembly according to claims 1 and 10. Advantageous embodiments of the debris mitigation device and the driving assembly are subject matter of the dependent claims or are described in the subsequent portions of the description.

The proposed debris mitigation device is mainly intended for use with a radiation source generating optical radiation, in particular EUV radiation and/or soft x-rays, and emitting undesired substances and/or particles which can deposit on optical surfaces in a radiation path of said radiation source. The debris mitigation device comprises at least one rotating foil trap allowing a straight passage of said radiation generated by said radiation source and preventing an amount of said undesired substances and/or particles to pass through, and a drive unit or drive assembly comprising a driving motor and a driving axis, to which said rotating foil trap is fixed.

The driving motor and the bearings supporting the driving axis are enclosed in a casing, which has an aperture for the driving axis and at least one outlet opening for a sealing gas. The aperture of the casing is designed to provide a gap between the driving axis and the casing, which gap is connected to a supply pipe for supplying the sealing gas through said gap into the casing. The connection of the gap to the supply pipe is a flow connection which means that the supply pipe must not necessarily be mechanically connected to the housing but the opening of the supply pipe must be close enough to the gap to achieve a flow of a sealing gas supplied through the supply pipe to enter the gap at least partly. The casing is designed gas tight with the exception of the aperture and the outlet opening. The sealing gas supplied through the gap to the inside of the casing can leave the casing through the outlet opening. The outlet opening preferably is connected gas tight to an appropriate exhaust pipe. The exhaust pipe may be connected to a pump or may be open to the atmosphere. In order to achieve a sufficiently high gas flow velocity of the sealing gas through the gap into the casing, the gap width is preferably selected smaller than 200 µm. The length of the gap in flow direction is preferably selected between 5 and 40 mm. The supply pipe connected to the gap of the casing may be formed in part integral with the debris mitigation device or may also be formed as an integral part of the drive unit.

This construction of the debris mitigation device or drive assembly allows the supply of a sealing gas through the narrow gap between the driving axis and the casing to the inside of the casing. The sealing gas flows with a sufficiently high velocity through this narrow gap, which velocity is higher than typical diffusion velocities of contaminating gases or vapors inside of the casing within the sealing gas, so that diffusion of contaminations in the counter direction of the flow of the sealing gas through the gap is prevented. Therefore, with the proposed construction there is no need to use special gas tight driving motors with minimum outgassing or to avoid any lubricating or oiling of the bearings which are also arranged inside of the casing. A contamination of the vacuum or buffer gas outside of the casing is prevented by the flow of the sealing gas. Since the proposed construction allows the use of long-life conventional motors and the bearings can be oiled or lubricated, the service life of the drive assembly is significantly enhanced.

Preferably, a lead-through for said driving axis is arranged between the rotating foil trap and the casing. This lead-through is designed to form a further gap between the driving axis and a surrounding wall, the further gap being connected to the supply pipe together with the gap between said driving axis and the casing. This additional measure provides a high flow resistance for the flow of the sealing gas away from the gap between the driving axis and the casing. Therefore, a high pressure of the sealing gas can be maintained at the entrance of this gap.

In an embodiment of the debris mitigation device or drive assembly, a check valve is arranged inside of the casing to avoid a backflow of gases or vapors inside of the casing through the gap, if for any reason the flow of sealing gas is interrupted. Such a check valve may have different constructions known to the skilled person. A check valve commonly comprises a moving part and a valve seat. The check valve is open at normal operation conditions, i. e. when the gas flow of the sealing gas through the gap is maintained, and is closed if this gas flow stops. Since through the flow of the sealing gas the pressure in the vicinity of the gap is always higher than the pressure inside of the casing, the check valve may open automatically through this gas flow. The closing of the check valve in the absence of such a gas flow may be forced automatically by the different pressure distribution at the check valve in such a case. If the gas flow stops, the pressure inside of the casing will be higher than the pressure in the gap, resulting in a pressure force which causes the movable component of the check valve to close the valve. Nevertheless, any additional components, for example appropriate spring elements, may also be used to close the valve in such a case. By this measure the contamination of the vacuum chamber outside of the casing is prevented, even when the supply of the sealing gas fails for any reason.

The proposed debris mitigation unit may have one single rotating foil trap or any combination of rotating foil traps or rotating foil traps with static foil traps. In one of the embodiments, the debris mitigation device is composed of a static foil trap and a rotating foil trap which are separated by a intermediate space. The driving axis extends through a lead-through in the center of the static foil trap to the rotating foil trap, wherein a small gap is formed between the driving axis and a surrounding wall. The supply pipe for the sealing gas is in this case connected to the room between the gap between the driving axis and the casing, that one part of the supplied sealing gas passes through this gap to the inside of the casing, and the gap between the driving axis and the surrounding wall, which can—for example—be formed by the core of the static foil trap, that the other part of the supplied sealing gas passes through to the intermediate space between the static foil trap and the rotating foil trap. By using a buffer gas applied for the debris mitigation anyway as a sealing gas, this flow of the buffer gas into the space between the two foil traps is additionally useful to suppress the passage of debris particles through the foil traps.

Preferably the gap between the driving axis and the surrounding wall is smaller than 100 µm. The gap length in the flow direction of the sealing gas is preferably between 5 and 40 mm. Generally the flow of sealing gas into the space between the foil traps can be dimensioned such that the sealing gas together with the normally used buffer gas inside of the vacuum chamber has an optimal gas pressure distribution inside of the foil trap to achieve a maximum suppression of the passage of debris.

In addition to the construction of the above embodiment, a backflow for part of the sealing gas can be provided between the sealing gas supply at the axis and the intermediate space between the two foil traps. To this end, for example, an additional channel can be formed from the gap between the driving axis and its surrounding wall through the core of the static foil trap. Through this additional channel part of the sealing gas can be pumped out leading to a reduction of the sealing gas flow to the space between the two foil traps, if this is necessary for an optimal gas pressure distribution in the foil trap system.

Since the gaps between the driving axis and the casing and between the driving axis and its surrounding wall are substantially small, only small cross sections of the supply pipe and the optional backflow pipe, for example of between 4 and 12 mm, and accordingly small pumping powers are required.

The corresponding driving assembly or driving unit which can be used in such a debris mitigation device accordingly comprises a driving motor and a driving axis for driving a component as well as appropriate bearings. The driving motor together with the bearings is enclosed in a casing having an aperture for the driving axis and at least one outlet opening for the sealing gas. The aperture is designed to define a gap between the driving axis and the casing, wherein the gap is connected to a supply pipe for supplying a sealing gas through said gap into the casing.

It is obvious for the skilled person that such a driving assembly may also be used in other applications in which contamination of a surrounding chamber or space through gases or vapors produced by operation of the drive assembly must be avoided. A preferred application is the use with a debris mitigation device as described above. In such a debris mitigation device the foil traps can be designed in a known manner. It is obvious that the individual construction of such a foil trap does not influence the inventive solution. Examples of appropriate foil traps can be found in the documents cited in the introductory portion of this description or in any other documents dealing with debris mitigation in EUV illumination systems.

BRIEF DESCRIPTION OF THE DRAWINGS

The following exemplary embodiments show examples of the present debris mitigation device and driving assembly with reference to the accompanying figures without limiting the scope of protection as defined by the claims. The figures show:

DETAILED DESCRIPTION OF EMBODIMENTS

Figure 1:
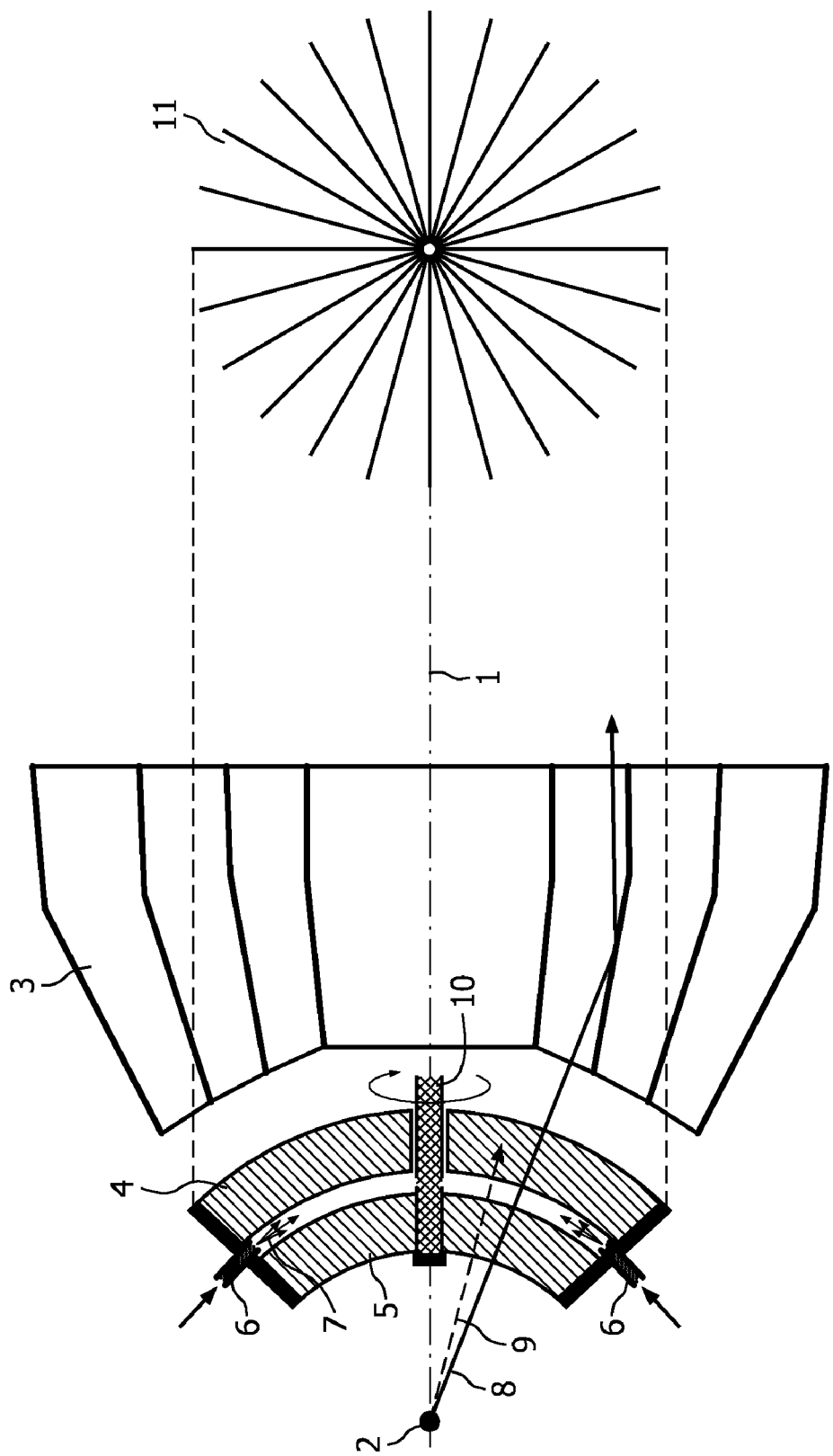
FIG. 1 a schematic view of a known debris mitigation device.

FIG. 1 shows a schematic view of a debris mitigation device with a foil trap in a EUV irradiation unit as known in the art. A EUV plasma source 2 as the radiation source emits EUV radiation which is collected and focused with a collector 3. The EUV plasma source 2 not only emits the desired EUV radiation but also undesired debris particles. The optical axis is depicted with reference sign 1, an exemplary radiation path of the EUV radiation with reference sign 8 and an exemplary path of a debris particle with reference sign 9.

The debris mitigation device is arranged between the EUV plasma source 2 and the collector 3 in order to suppress the passage of debris particles to the collector 3. The debris mitigation device in this example comprises a static foil trap 4 and a rotating foil trap 5. The static foil trap 4 in this example is composed of a plurality of single foil sheets 11 extending in radial direction from the optical axis 1. The construction of this foil trap can be seen on the right hand side of FIG. 1, representing a view in the direction of the optical axis 1. The whole arrangement has a rotational symmetry around this optical axis 1.

The debris mitigation device also comprises feed pipes 6 for the supply of a buffer gas into an intermediate space between the two foil traps 4, 5. Through the flow 7 of this buffer gas, debris particles which still pass through the rotating foil trap 5 are decelerated or deflected by collisions with the buffer gas in order to condense on the foil sheets of the static foil trap 4 and the rotating foil trap 5. The buffer gas leaving the foil traps is pumped out through the collector 3, in the regions between the debris mitigation device and the collector 3 and between the debris mitigation device and the EUV plasma source 2 by vacuum pumps.

Macroscopic debris particles like clusters or droplets can be effectively stopped by the rotating foil trap 5 which is arranged in front of the static foil trap 4. As in the case of the static foil trap 4, the rotating foil trap 5 is also constructed by a plurality of foil sheets 11 which are mounted on a core 16. The core 16 is mounted on a driving axis 10 which extends through a lead-through in the core 15 of the static foil trap 4 to a driving motor not shown in FIG. 1.

Figure 2:
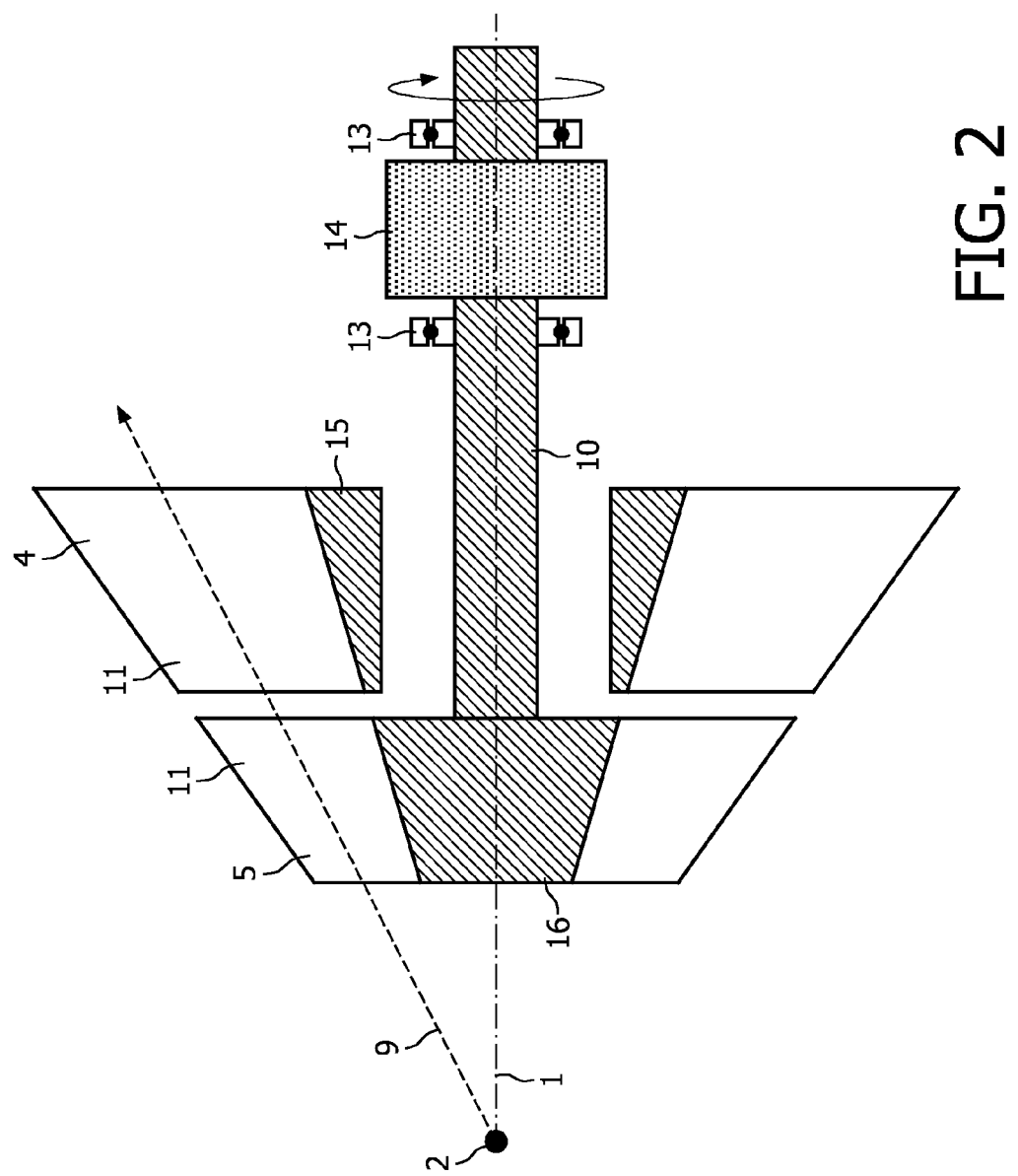
FIG. 2 a schematic view of a driving unit of such a device as known in the art.

FIG. 2 shows a schematic view of a drive unit for driving the rotating foil trap 4 as known in the art. The driving axis 10 of the driving motor 14 is supported by two bearings 13 in order to allow a stable rotational movement of this axis 10 around the optical axis 1. The core 16 of the rotating foil trap 5 is fixed to one end of this driving axis 10.

As already explained, the bearings 13 of such a drive assembly, when used in an EUV illumination unit as shown in FIG. 1, can not be oiled or lubricated in order to avoid the generation of contaminant oil or grease vapors. Furthermore, the driving motor 14 must be specially constructed to be vacuum tight in order to minimize outgassing during operation. The lack of an appropriate lubrication of the bearings 13 leads to a very low service life of the drive assembly. This drawback is avoided with the debris mitigation device and drive assembly according to the present invention.

Figure 3:
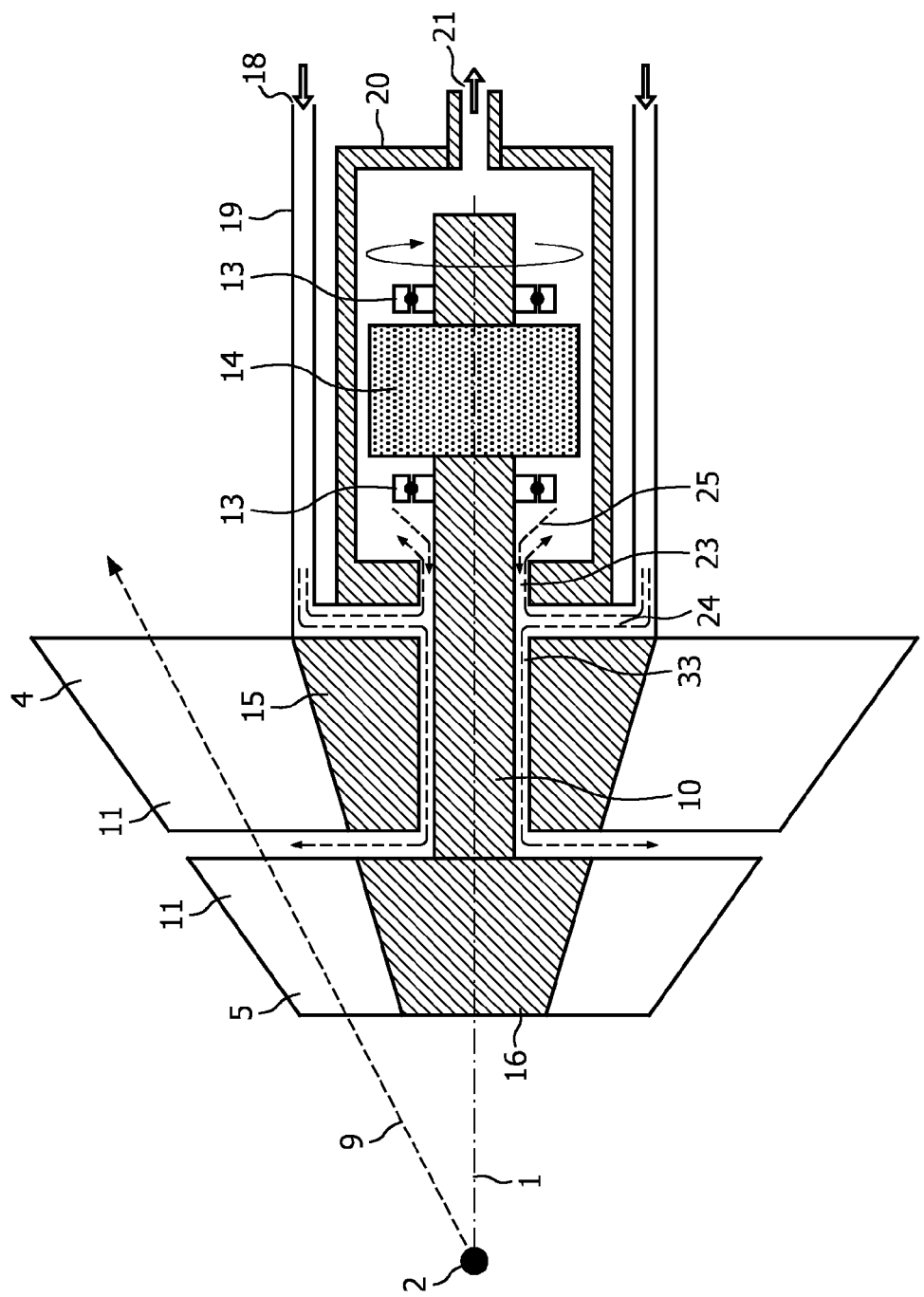
FIG. 3 a schematic view of a first embodiment of the proposed debris mitigation device.

FIG. 3 shows a schematic view of one exemplary embodiment of the proposed debris mitigation device and drive assembly. In this and all preceding and following figures identical reference signs are used for the same components of such a device. The components already described in FIGS. 1 and 2 therefore are not explained in the following again.

In the exemplary embodiment of FIG. 3, the driving motor 14 and the bearings 13 are arranged inside of a gas tight casing 20 which only comprises an aperture for the driving axis 10 and an outlet opening 21 for a sealing gas. The aperture for the driving axis 10 is designed to define a small gap 23 between the driving axis 10 and the casing 20. A similar small gap 33 is formed between the driving axis 10 and a surrounding wall, which in this embodiment is identical to the core 15 of the static foil trap 4, as can be seen in FIG. 3. The gaps are connected to a supply pipe 19 for supply 18 of a sealing gas. This sealing gas flows through both gaps, i. e. through the gap 23 between the driving axis 10 and the casing 20 to the inside of the casing 20 and through the gap 33 between the driving axis 10 and the core 15 of the static foil trap 4. The gas flow 24 is schematically indicated in FIG. 3. Although in this and the following figure two supply pipes 19 are shown, the number of supply pipes is not essential for the functionality of the invention. The device may also comprise for example only one supply pipe 19 on one side of the casing 20 and connected to a ring like space at the small gap 23, or a supply pipe 19 formed to completely surround the casing 20, or even more than two supply pipes 19.

The part of the sealing gas flow through the gap 33 between the driving axis 10 and the core 15 of the foil trap 4 leads to the intermediate space between the two foil traps. In this space the sealing gas helps to suppress the passage of debris through the mitigation device. The other portion of the sealing gas flow passing through the gap 23 between the driving axis 10 and the casing 20 prevents the passage of any contaminant gases or vapors in the counter direction. Due to the small gap 23 between the driving axis 10 and the casing 20, the flow velocity of the sealing gas is significantly higher than any diffusion velocity of contaminant gases inside of the casing 20. An exemplary flow 25 of these contaminant gases is indicated in the figure. Therefore, the passage of contaminant gases or vapors from the bearing 13 or from the motor 14 inside of the casing 20 to the vacuum chamber, in which the debris mitigation device is arranged, is optimally prevented. With such a construction, therefore, the bearings 13 may be oiled or lubricated as required in order to achieve a long service life of these components. Furthermore, it is no more necessary to use a special gas tight motor 14. Standard motors can be used, which are substantially cheaper than special gas tight or vacuum compatible motors. The sealing gas entering the casing 20 can leave this casing through outlet opening 21. The outlet opening 21 preferably is connected gas tight to an appropriate exhaust pipe. The exhaust pipe may be connected to a pump or may be open to the atmosphere.

Figure 4:
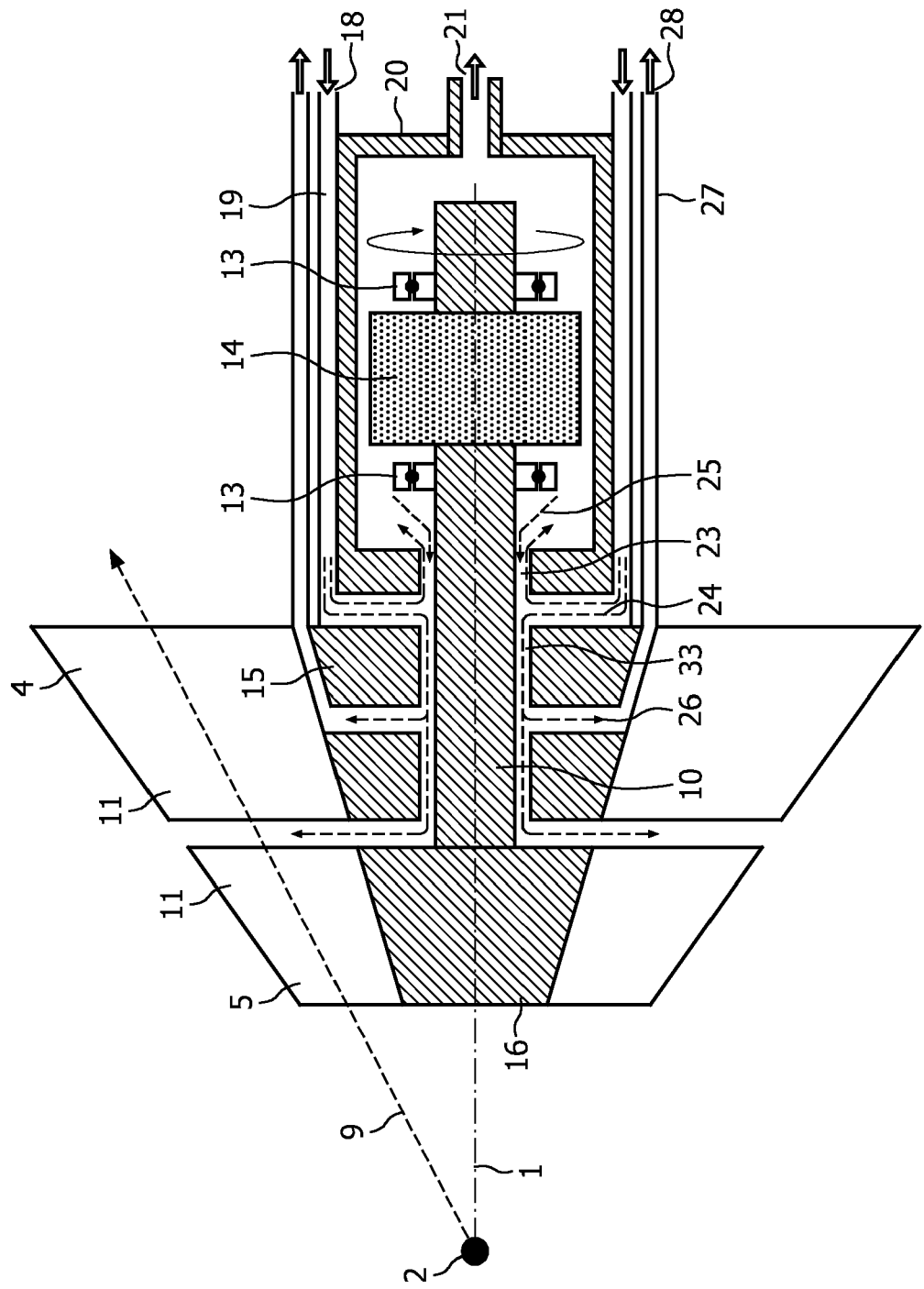
FIG. 4 a schematic view of a second embodiment of the proposed debris mitigation device.

FIG. 4 shows a further exemplary embodiment of the proposed debris mitigation device in a schematic view. In this embodiment, in addition to the embodiment of FIG. 3 an additional backflow of the sealing gas at a pumping space 26 is provided inside of the core 15 of the static foil trap 4. This additional pumping space 26 is connected to a pumping pipe 27 which leads to the outside of the vacuum system. With this additional pumping space 26 connected to the gap 33 between the driving axis 10 and the core 15 of static foil trap 4, it is possible to pump out a part of the sealing gas, if the sealing gas portion entering the intermediate space between the two foil traps is too high. The corresponding gas flow 28 in the pumping pipe 27 is indicated in the figure. With this measure a control of the amount of sealing gas or buffer gas entering the intermediate space between the two foil traps 4, 5 is possible. Although in this figure two pumping pipes 27 are shown, the number of pumping pipes 27 is not essential for the functionality of this measure. The device may also comprise for example only one pumping pipe 27 on one side, or a pumping pipe 27 formed to completely surround the casing 20, or even more than two pumping pipes 27.

During operation of an EUV irradiation unit, in addition to the normal operation condition also other operation conditions can arise, for example in an emergency case or in case of a technical defect. In order to avoid a contamination of the vacuum system through contaminant gases or vapors from the inside of the casing 20, further measures as shown in FIGS. 5a to 5d can be taken. In these embodiments, an additional check valve 29 is arranged inside of the casing 20 at the gap 23 between the casing 20 and the driving axis 10. The four figures show cut out views of the corresponding portion of the drive unit.

Figure 5A:
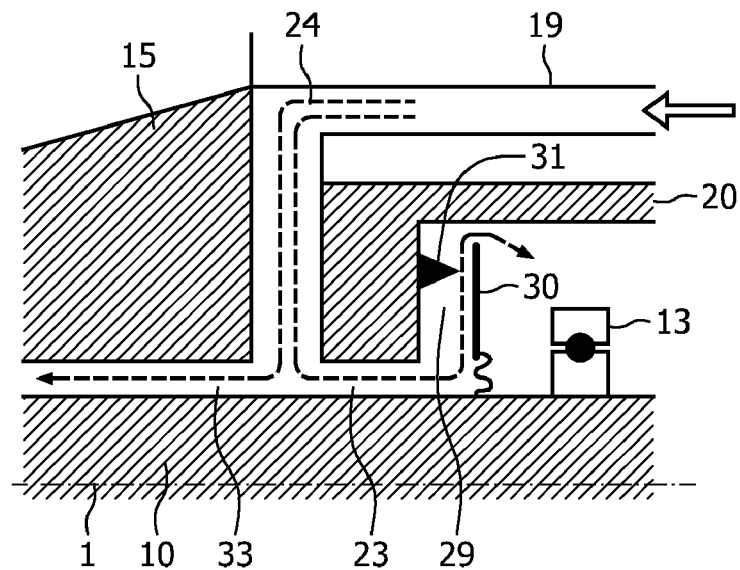
FIG. 5a-d four schematic cutout views of portions of the proposed driving assembly showing two different constructions of check valves in open and closed states.
Figure 5B:
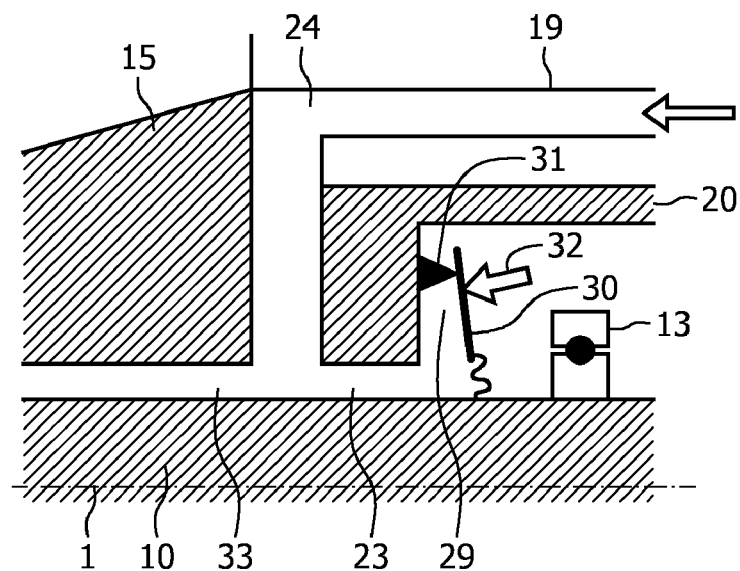
Figure 5C:
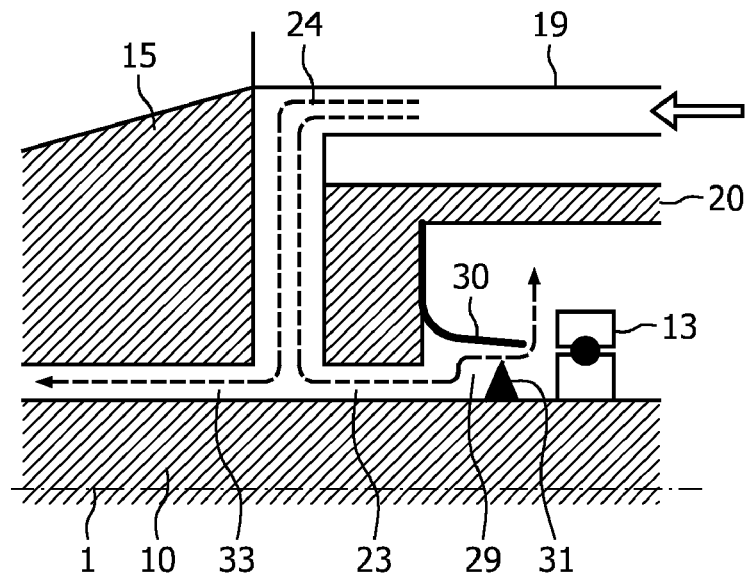
Figure 5D:
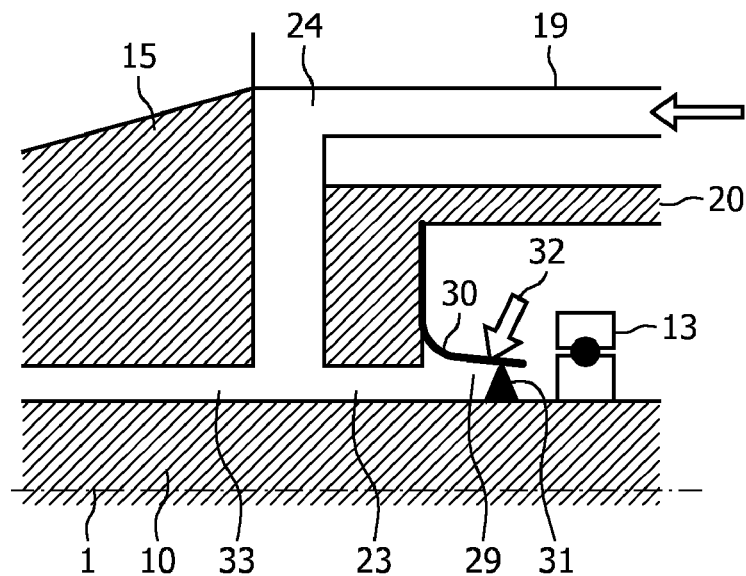

The check valve 29 can be realized in different ways. FIG. 5 shows two possible constructions. In FIGS. 5a and 5b the open and closed state of the checking valve 29 is shown for one exemplary embodiment, in FIGS. 5c and 5d for another exemplary embodiment.

The check valve 29 is composed of a movable component 30 and a valve seat 31. Both components are arranged such that the check valve is open in the normal operation condition. This open state is achieved through the gas flow of the sealing gas which generates a higher local gas pressure inside of the gap 23 compared to the gas pressure inside of the casing 20.

In a extraordinary state of the system, when for any reason the normal sealing gas flow through the gap 23 is interrupted, the pressure distribution around the checking valve 29 changes such that now the pressure on the side of the check valve towards the casing 20 is substantially higher than on the side towards the gap 23. In this situation a pressure force 32 acts on the movable component 30 of the check valve 29, which closes the valve. In this closed state any gas flow from the inside of the casing 20 to the vacuum system is inhibited and any contamination of the vacuum system from the inside of the casing 20 is avoided. The movable component 30 of the checking valve 29 may be made of an elastic material like in FIGS. 5c and d or may be connected to a spring like element like in FIGS. 5a and 5b. The elastic element of check valve may also be designed such that the valve is in its closed state when there is no pressure difference between the side towards the casing 20 and the side towards the gap 23. In normal operation it is opened by the sealing gas flow in this case.

While the invention has been illustrated and described in detail in the drawings and forgoing description, such illustration and description are to be considered illustrative or exemplary and not restrictive, the invention is not limited to the disclosed embodiments. The different embodiments described above and in the claims can also be combined. Other variations to the disclosed embodiments can be understood and effected by those skilled in the art in practicing the claimed invention, from a study of the drawings, the disclosure and the appended claims. For example, the debris mitigation device may be composed of only one rotating foil trap or of several rotation foil traps which may also be driven by different drive units. In such a case all drive units are constructed according to the present invention. Furthermore, the design of the foil trap is not limited to the design shown in the figures. Any appropriate design with structures allowing a straight passage of the generated radiation and reducing the amount of debris which may pass through the foil trap can be realized with the present invention. In particular it is emphasized that the structures of the foil trap must not necessarily be made of foils. Also thicker structures are possible. The pipes for supplying the sealing gas may be arranged as integral parts of the foil trap or of the casing of the driving unit, but may also realized as separate components. It is also possible to provide several supply pipes.

In the claims, the word "comprising" does not exclude other elements or steps, and the indefinite article "a" or "an" does not exclude a plurality. The mere fact that measures are recited in mutually different dependent claims does not indicate that a combination of these measures cannot be used to advantage. The reference signs in the claims should not be construed as limiting the scope of these claims.

LIST OF REFERENCE SIGNS 1 optical axis
2 EUV plasma source
3 collector
4 static foil trap
5 rotating foil trap
6 feed pipes
7 flow of buffer gas
8 path of EUV radiation
9 path of debris particles
10 driving axis
11 foil sheet
13 bearings
14 driving motor
15 core of static foil trap
16 core of rotating foil trap
18 sealing gas supply
19 supply pipe
20 casing of drive unit
21 outlet for sealing gas
23 gap
24 flow of sealing gas (symbolic)
25 flow of contaminant gases (symbolic)
26 pumping space
27 pump pipe 28 gas flow (symbolic)
29 check valve
30 movable component of check valve
31 valve seat of check valve
32 pressure force (symbolic)
33 further gap

The invention claimed is:

1. A debris mitigation device for use with a radiation source generating optical radiation, and emitting undesired substances and/or particles, said debris mitigation device comprising a rotating foil trap and a drive unit comprising a casing, at least a driving motor and a driving axis, to which said rotating foil trap is fixed outside of said casing, said driving axis being supported by lubricated bearings, wherein said driving motor and said bearings are enclosed in said casing having an aperture for said driving axis and at least one outlet opening for a sealing gas, said outlet opening being connectable to a pump for pumping out the sealing gas, said aperture being designed to define a gap between said driving axis and said casing, said gap being connected to a supply pipe for supplying said sealing gas through said gap into said casing, wherein a lead-through for said driving axis is arranged between said rotating foil trap and said casing, said lead-through being designed to form a further gap between said driving axis and a surrounding wall, said further gap being connected to said supply pipe together with said gap between said driving axis and said casing, and wherein said debris mitigation device further comprises a static foil trap which is arranged between said rotating foil trap and said driving unit.

2. The device according to claim 1, wherein said lead-through is formed in said static foil trap.

3. The device according to claim 1, wherein said lead-through extends into an intermediate space formed between said rotating foil trap and said static foil trap.

4. The device according to claim 1, wherein said surrounding wall defines a pumping space to said further gap, said pumping space being connected to a pumping pipe, which is connectable to a pump for pumping out the sealing gas.

5. The device according to claim 1, wherein said gap between said driving axis and said casing has a gap width smaller than 200 μm.

6. The device according to claim 1, wherein said further gap between said driving axis and said surrounding wall has a gap width smaller than 100 μm.

7. The device according to claim 1, wherein said drive unit comprises a check valve in said casing, said check valve being designed and arranged to close said gap between said driving axis and said casing if a flow of said sealing gas through said gap is interrupted.

8. The device according to claim 7, wherein said check valve is designed and arranged to automatically close said gap due to pressure differences arising if the flow of said sealing gas through said gap is interrupted or due to the action of an elastic element attached to a movable component of the check valve.

9. A drive assembly, comprising a casing, a driving motor and a driving axis for driving a component arranged outside of said casing, said driving axis being supported by lubricated bearings, wherein said driving motor and said bearings are enclosed in said casing having an aperture for said driving axis and at least one outlet opening for a sealing gas, said outlet opening being connectable to a pump for pumping out the sealing gas, said aperture being designed to define a gap between said driving axis and said casing, said gap being connected to a supply pipe for supplying said sealing gas through said gap into said casing and further comprising a check valve in said casing, said check valve being designed and arranged to close said gap between said driving axis and said casing if a flow of said sealing gas through said gap is interrupted.

10. The drive assembly according to claim 9, wherein a lead-through for said driving axis is arranged between said component and said casing, said lead-through being designed to form a further gap between said driving axis and a surrounding wall, said further gap being connected to said supply pipe together with said gap between said driving axis and said casing.

11. The drive assembly according to claim 10, wherein said surrounding wall comprises a pumping space to said further gap, said pumping space being connected to a pumping pipe, which is connectable to a pump for pumping out the sealing gas.

12. The drive assembly according to claim 9, wherein said gap between said driving axis and said casing has a gap width smaller than 200 μm.

13. The drive assembly according to claim 9, wherein said check valve is designed and arranged to automatically close said gap due to pressure differences arising if the flow of said sealing gas through said gap is interrupted or due to the action of an elastic element attached to an movable component of the check valve.

* * * * *